United States Patent [19]
Kweon

[11] Patent Number: 5,656,856
[45] Date of Patent: Aug. 12, 1997

[54] REDUCED NOISE SEMICONDUCTOR PACKAGE STACK

[75] Inventor: Young Do Kweon, Seoul, Rep. of Korea

[73] Assignee: Samsung Electronics Co., Ltd., Suwon, Rep. of Korea

[21] Appl. No.: 487,323

[22] Filed: Jun. 7, 1995

[30] Foreign Application Priority Data

Jun. 9, 1994 [KR] Rep. of Korea .................. 1994-12951

[51] Int. Cl.$^6$ ............... H01L 23/02; H01L 23/48
[52] U.S. Cl. ................. 257/686; 257/685; 257/723; 257/777
[58] Field of Search ................... 257/685, 686, 257/723, 777

[56] References Cited

U.S. PATENT DOCUMENTS

| | | | |
|---|---|---|---|
| 4,945,399 | 7/1990 | Brown et al. | 257/698 |
| 4,956,694 | 9/1990 | Eide | 257/668 |
| 5,198,888 | 3/1993 | Sugano et al. | 257/686 |
| 5,237,204 | 8/1993 | Val | 257/698 |
| 5,266,912 | 11/1993 | Kledzik | 257/777 |
| 5,448,106 | 9/1995 | Fujitsu | 257/668 |

*Primary Examiner*—Mahshid D. Saadat
*Assistant Examiner*—T. M. Arroyo
*Attorney, Agent, or Firm*—Cushman Darby & Cushman IP Group of Pillsbury Madison & Sutro LLP

[57] ABSTRACT

A semiconductor package stack assembly providing reduced electrical noise, in which a conductive film is provided on an exposed bottom surface of the semiconductor chip of each semiconductor package in a unitary stack thereof, each conductive film being grounded to ground lines of the printed circuit board on which the lowermost package of the stack is surface-mounted.

16 Claims, 9 Drawing Sheets

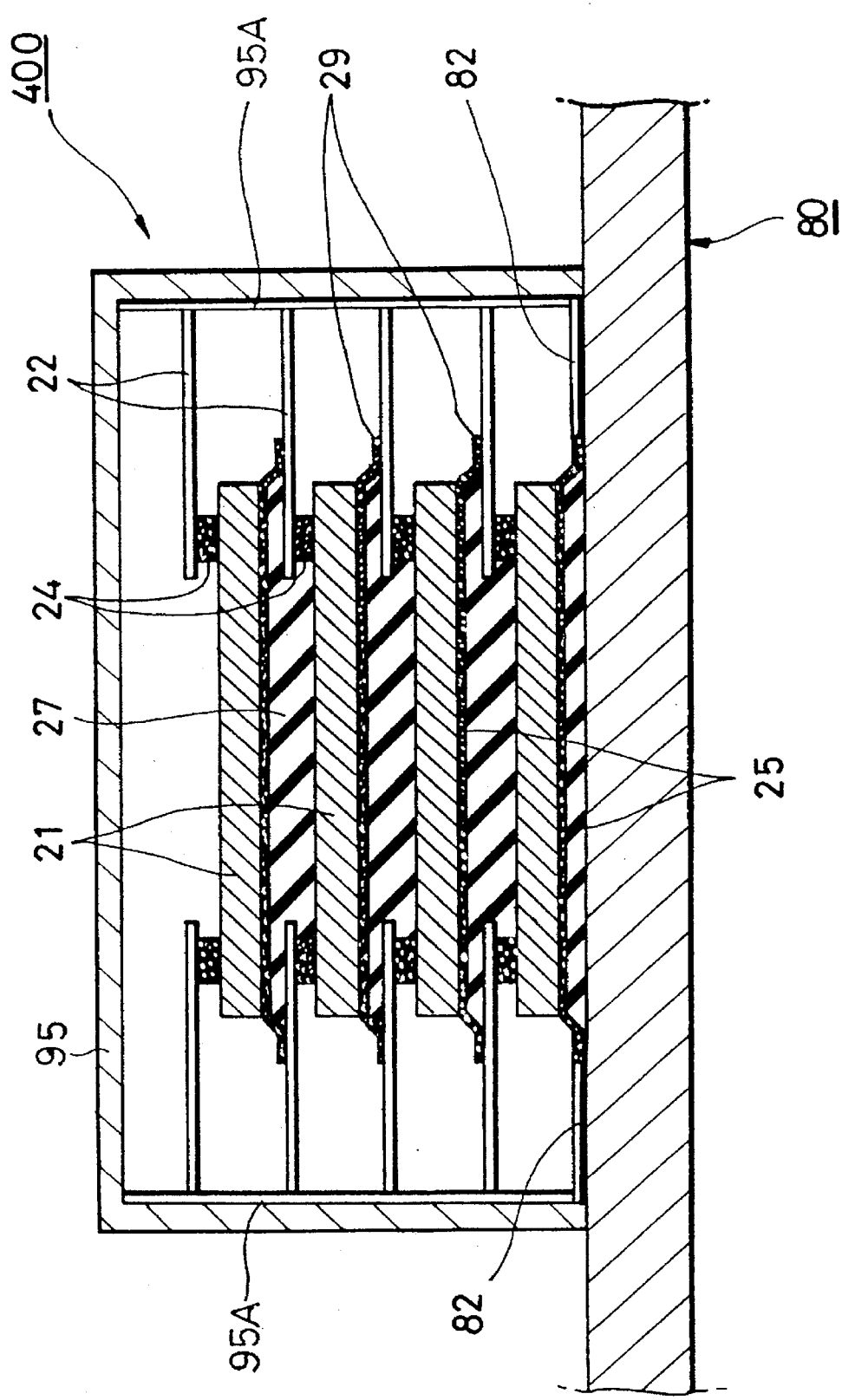

1

REDUCED NOISE SEMICONDUCTOR PACKAGE STACK

BACKGROUND OF THE INVENTION

1. Field of the Invention

The present invention relates generally to a semiconductor package stack arranged to be mounted on a printed circuit board (PCB), and, more particularly, to a semiconductor package stack which provides reduced electrical noise, comprising a conductive film formed on an exposed bottom surface of the chip of each semiconductor package of the stack, each conductive film being grounded to ground lines of the PCB.

2. Description of the Prior Art

Recently, there has been a trend towards making modules and surface mounting packages compact and thin in order to provide highly dense mounting of semiconductor packages. In compliance with this trend, compact and thin packages such as TSOP (Thin Small Outline Package) and UTSOP (Ultra Thin Small Outline Package) have been developed, and these packages are used mainly for main memory devices of computers.

The integration density of IC (Integrated Circuit) devices can be increased by forming finely the elements which constitute the IC and the metal wiring which connects these elements. However, this method is difficult to put into practical use, due to limitations present in fabrication.

To avoid these problems, methods for increasing mounting density by mounting a highly dense packaged module, or by stacking high density chips, in a three-dimensional arrangement has been proposed. A highly dense mounting of chips on a substrate such as a printed circuit board can be accomplished by mounting a plurality of surface-mounting chips or TAB (Tape Automated Bonding) packages on the substrate.

However, as very large scale integrated (LSI) circuits tend to get more complex, there is a need to switch more output driver circuits simultaneously, at a faster rate, in order to increase the performance thereof. This increase in the switching speed results in an increase in the amount of electrical noise which is associated therewith. Therefore, various attempts for reducing or minimizing the noise associated with the increase in the switching rate have been made.

For example, U.S. Pat. No. 4,945,399 to Brown discloses a semiconductor chip package wherein additional capacitors such as decoupling capacitors are coupled between the associated voltage pins.

Another example is a semiconductor device stack disclosed in U.S. Pat. No. 5,198,888 to Toshio Sugano et al. U.S. Pat. No. 5,198,888 teaches semiconductor device stack as shown in FIG. 1A.

With reference to FIG. 1A, the semiconductor package stack (100) has a structure wherein four semiconductor packages (10) are stacked on a substrate, for example, PCB (80) by using connectors (frames) (40). The frame (40) is surface-mounted on a land pattern (82) formed on the PCB (80) so that a chip (21) of the package (10) is located above a capacitor (60) formed on a capacitor land pattern (82).

To describe in more detail, for the lowest (first) package (10) of the stack, an extended outer lead (22) is electrically connected to a circuit pattern (43) formed on the upper surface of the frame (40) of the lowest package with solder (91). The circuit pattern (43) is connected to a circuit pattern (44) formed on the lower surface of the frame (40) of the second lowest package of the stack by solder (91). For the second lowest package (10), an extended outer lead (22) is electrically connected to a circuit pattern (43) formed on the frame (40) of the second package by solder (91), and the respective circuit pattern (44) is electrically connected to the circuit pattern (43) formed on the lower surface of the frame (40) of the third stacked package with solder (91). Consequently, there is formed a space between the bottom surface of chip of the second stacked package (10) and the upper surface of the resin (28) of the first stacked package (10).

The third and fourth packages are consecutively stacked above the second stacked package by following the same fabrication process.

Thus fabricated, a semiconductor package stack (100) is mounted on the PCB (80) in such a way that the circuit patterns (44) formed on the bottom surface of the frame (40) of the first stacked package are connected to land patterns (82) of the PCB by solder (91).

The packages (10) each has a structure in which bonding pads (not shown) are formed on the upper surface of the chip (21), leads (22) are formed on an insulating film (26) of a tape carrier, an internal part of each lead (22) is electrically connected to the corresponding bonding pad by a respective bump (24), and the chips (21), bumps (24) and leads (22) are encapsulated in a body of resin (28) so that the bottom surface of the chip and extended outer parts of the leads (22) are exposed.

Each frame (40) is formed with circuit patterns (43) and (44) on the upper and lower surfaces thereof, and formed with vertical through holes (42), which are indicated in FIG. 1(A) by broken lines. Conductive thin layers are formed on the bonding surfaces of the respective through holes, and electrically connect the circuit patterns (43) and (44) of each frame (40) to one another.

The PCB (80) is formed so as to have land patterns (82) on its upper surface, and a capacitor (60) is formed on the capacitor land pattern (82) which faces the bottom surface of the first stacked package (10).

The land patterns (82) of the PCB (80), the circuit patterns (43), (44) formed on the upper and lower surfaces of the frames (40), the leads (22) of the package (10), bonding pads of the chips (21) and ground lines (not shown) of the PCB (80) are electrically interconnected.

For the above-described package stack (100), the capacitor (60) is designed to serve as a noise filter when mounting the package stack (100) on the land patterns (82) of the PCB (80).

FIG. 1(B) is a cross-sectional view for showing the working effect of the package stack depicted in FIG. 1(A), wherein a MOS (Metal Oxide Semiconductor) element is formed with a PN diode between a silicon substrate and an active area thereof.

With reference now to FIG. 1(B), electric noise can be reduced to some extent by grounding the n+ embedded layer to the p+ embedded layer by a capacitor.

The conventional package having bumps has an exposed bottom surface of silicon substrate, while the top surface has internal terminals of the chip, which are connected to the external terminals. The diode formed between the substrate and the active area to which a Vss voltage pin is not connected is designed to have a reverse bias and, consequently, is turned off during an operation. However, in the case of an alternating current operation, because a lower electric potential is formed at the active area and the diode has a forward bias, the diode is turned on, resulting in an unstable operation of elements. This is the same for the N-type substrate.

The discrete capacitors formed depart away from the semiconductor chip are electrically connected to the chip by a plurality of wiring lines or large power buses. The wiring lines are a representative example of high inductance paths. As the current of wiring lines increases, the scale of voltage drop increases, which results in undesired power distribution noise. Consequently, the electrical noise can be reduced by forming the capacitors as near the chip as possible, to reduce, effective inductance of the current path.

Nevertheless, when taking account into the arrangement of wiring lines associated with chips and the size limitation of individual capacitors, it is very difficult to distribute the capacitors so as not to cause any power drop or noise. Further, since the capacitors employed for reducing or minimizing the noise are high frequency and low inductance capacitors, they are expensive, and this causes an inevitable increase in the production cost of the integrated circuits in which they are provided.

On the other hand, with reference to FIG. 2, which is a cross-sectional view of another semiconductor package stack, the package stack (150) is fabricated by stacking a plurality of, for example, four chips (21) and providing the resulting assembly with a cap (95).

To describe in more detail, for the first (lowest) stacked package, a plurality of bonding pads (not shown) formed on the chip (21) are electrically connected to the corresponding leads (22) by bumps (24), and leads (22) are electrically interconnected to each other through conductive layers (95A) formed on the internal opposite side surfaces of the cap (95).

The second through fourth stacked packages are stacked by the same fabrication process as described above.

The conductive layers (95A) of the cap (95) are formed on the opposite internal side surfaces, and commonly electrically interconnect the leads (22) to each other and to the land patterns (82) on the PCB (80). The cap (95) is mounted on the PCB (80) by a known mounting technique.

This type of package stack has a drawback, compared to that shown in FIG. 1A, in that the space between the lowest stacked package and the PCB is too narrow to permit the manufacturer to form and put in place a capacitor for reducing the noise beneath the lowest stacked package. If the formation of capacitor is desired, a separate space should be set aside for its location, causing a set-back in attempting to meet the objective of increasing the mounting density. Accordingly, there has been a need to provide a high speed, low noise semiconductor package stack without at the same time producing a disadvantage of reducing the mounting density. The present invention fulfills this need.

SUMMARY OF THE INVENTION

Thus, the first object of this invention is to provide a semiconductor package stack with reduced electrical noise, and high switching speed, by forming a conductive film on the bottom surface of the chip of each individual package that will be incorporated into the stack, and during the process of assembling the stack connecting each film to ground terminals formed on the edges of the frames, which interconnect the packages together, and to ground lines formed on a substrate.

The second object of this invention is to provide a semiconductor package stack with reduced electrical noise, and high switching speed, by forming a conductive film on the bottom surface of the chips of individual packages, interposing an insulating film between the bottom surface of the conductive film of each respective chip, and the upper surface of the respective neighboring lower package, electrically connecting ground terminals formed on each conductive film, to leads formed on the respective next lower package, and connecting the ground terminals formed on the edges of the frames which interconnect the packages, and to ground lines formed on the substrate.

To accomplish the first object, this invention encompasses a semiconductor package stack, having reduced noise, comprising:

a plurality of semiconductor packages, the packages being stacked one upon another in a single stack, and each having a semiconductor chip formed so as to have a plurality of bonding pads; a plurality of inner and outer leads; an insulating film of film carrier, which mounts the chips by electrically connecting the bonding pads to the corresponding inner leads, using provided bumps; and a molded-in-place covering, which protects each respective chip and its inner leads from the external environment, each chip having an exposed bottom surface;

a plurality of frames formed with circuit patterns on the top and bottom surfaces thereof, these circuit patterns being electrically connected to the outer leads to unite the individual semiconductor packages into a unitary stack; and a substrate formed so as to have ground land patterns, which are electrically commonly connected to the circuit patterns on the frames, and with one or more capacitor for reducing electrical noise, for each stack, the or each capacitor being formed onto a respective land pattern formed on a respective area of the substrate, beneath the exposed bottom surface of the lowermost chip in the stack, each package having a conductive film formed on the exposed bottom surface of the respective chip; and ground terminals, which are electrically connected to the conductive film as well as to the ground land patterns formed on the substrate.

To accomplish the second object, the present invention encompasses a semiconductor package stack, having reduced noise, comprising:

a plurality of semiconductor packages, each package being incorporated into a single stack, and having a semiconductor chip formed so as to have a plurality of bonding pads; a plurality of inner and outer leads; an insulating film of film carrier, which mounts the chips by electrically connecting the bonding pads to the corresponding inner leads, using bumps; and a body of molded-in-place material for each package, which protects the respective chip and inner leads from the external environment, each chip having an exposed bottom surface;

a plurality of frames formed with circuit patterns on the top and bottom surfaces thereof, these circuit patterns being electrically connected to the outer leads to unite the semiconductor packages into a stack; and a substrate formed so as to have ground land patterns, which are electrically commonly connected to the circuit patterns on the frames, and so as to have at least one capacitor for reducing electrical noise, each capacitor being formed onto a respective land pattern formed on an area of the substrate beneath the exposed bottom surface of the lowermost chip of the stack, each package having a conductive film formed on the exposed bottom surface of each chip;

an insulating film formed on a surface of the conductive film; and ground terminals, which are electrically connected to the conductive film as well as to the ground land patterns formed on the substrate.

This invention further encompasses another semiconductor package stack, having reduced noise, comprising:

a plurality of semiconductor packages, each package being incorporated into a single stack and having a semiconductor chip formed so as to have a plurality of bonding pads, and a plurality inner and outer leads to be electrically connected to the corresponding bonding pads, by bumps, to mount the chip;

a cap formed so as to have conductive layers on its inner opposite side surfaces, these conductive layers commonly electrically connecting the outer leads of each package together to unite the semiconductor packages into a unitary stack; and a substrate formed so as to have land patterns, which are electrically connected to the outer leads, by means of the conductive layer of the cap;

each package having a conductive film formed on a bottom surface of the respective chip;

an insulating film formed on a surface of the conductive film; and ground terminals, which are electrically connected to the conductive film as well as to the ground land patterns formed on the substrate.

BRIEF DESCRIPTION OF THE DRAWINGS

These and various other features and advantages of the present invention will be readily understood with reference to the following detailed description, taken in conjunction with the accompanying drawings, wherein like reference numerals designate like structural elements, and, in which:

FIG. 5A is a cross-sectional view of a third embodiment of a preferred semiconductor package stack according to the present invention;

DETAILED DESCRIPTION OF PREFERRED EMBODIMENTS

Figure 1A:
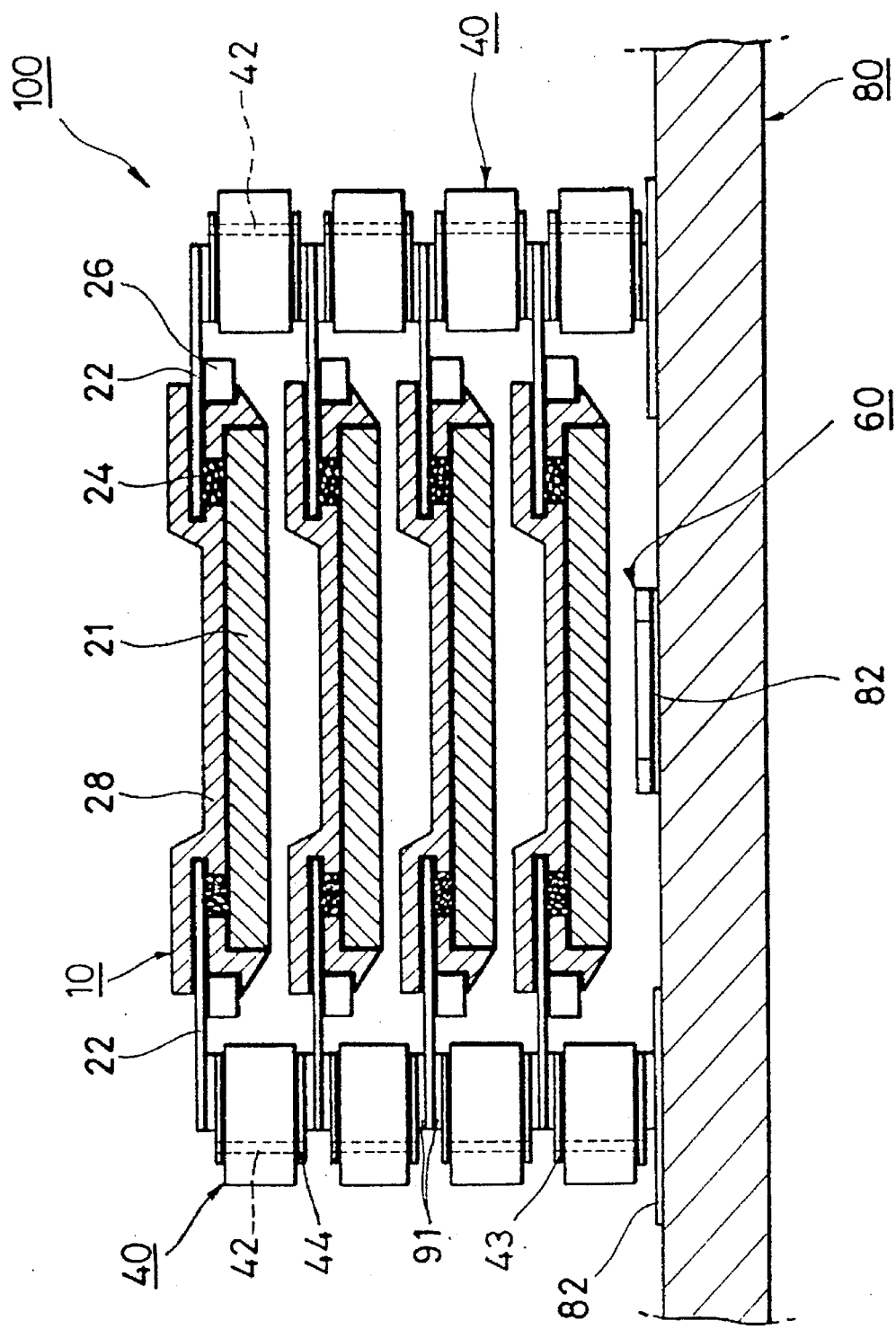
FIG. 1A is a cross-sectional view of one conventional semiconductor package stack.
Figure 1B:
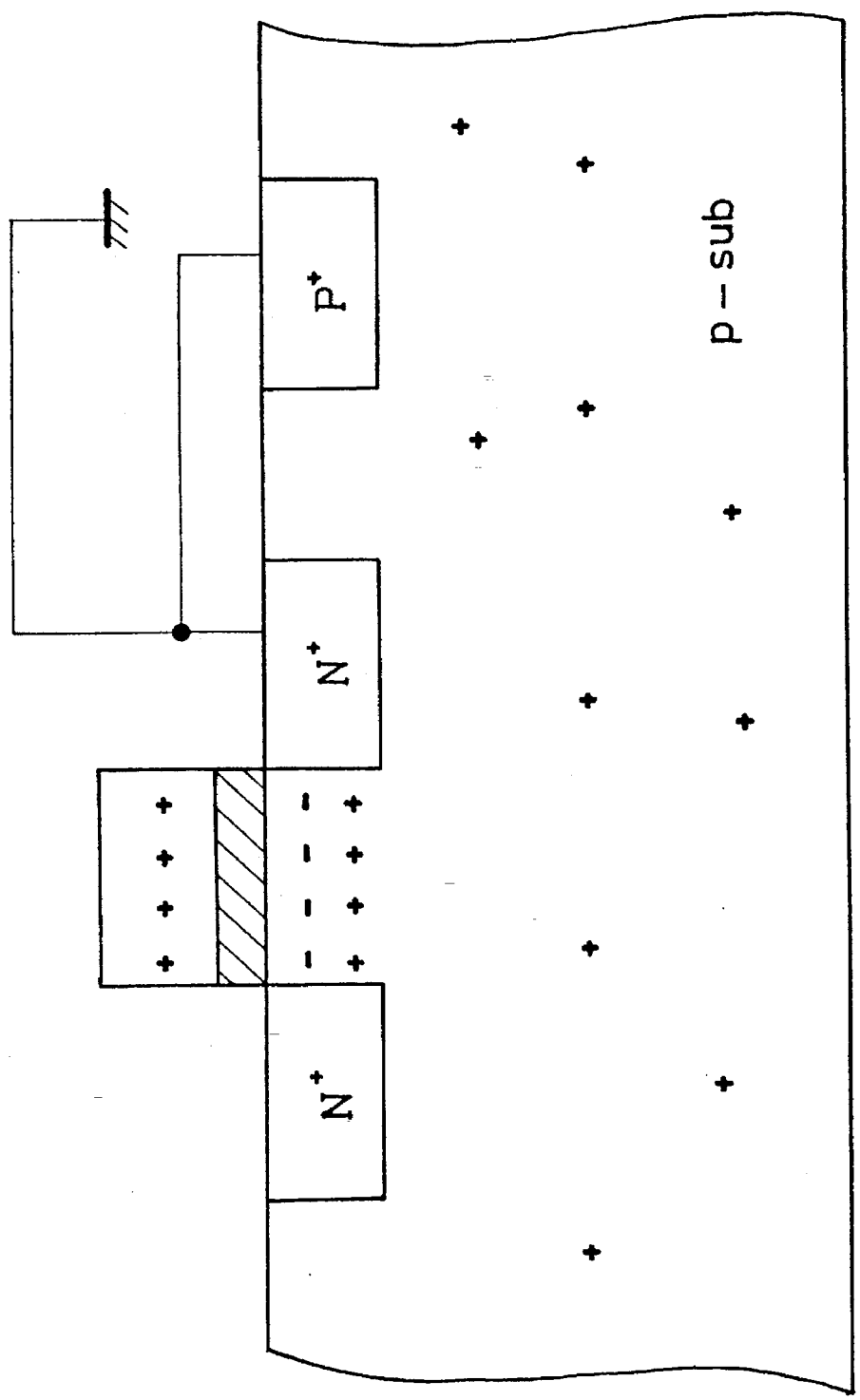
FIG. 1B a cross-sectional view showing the working effect of the package depicted in FIG. 1A.
Figure 2:
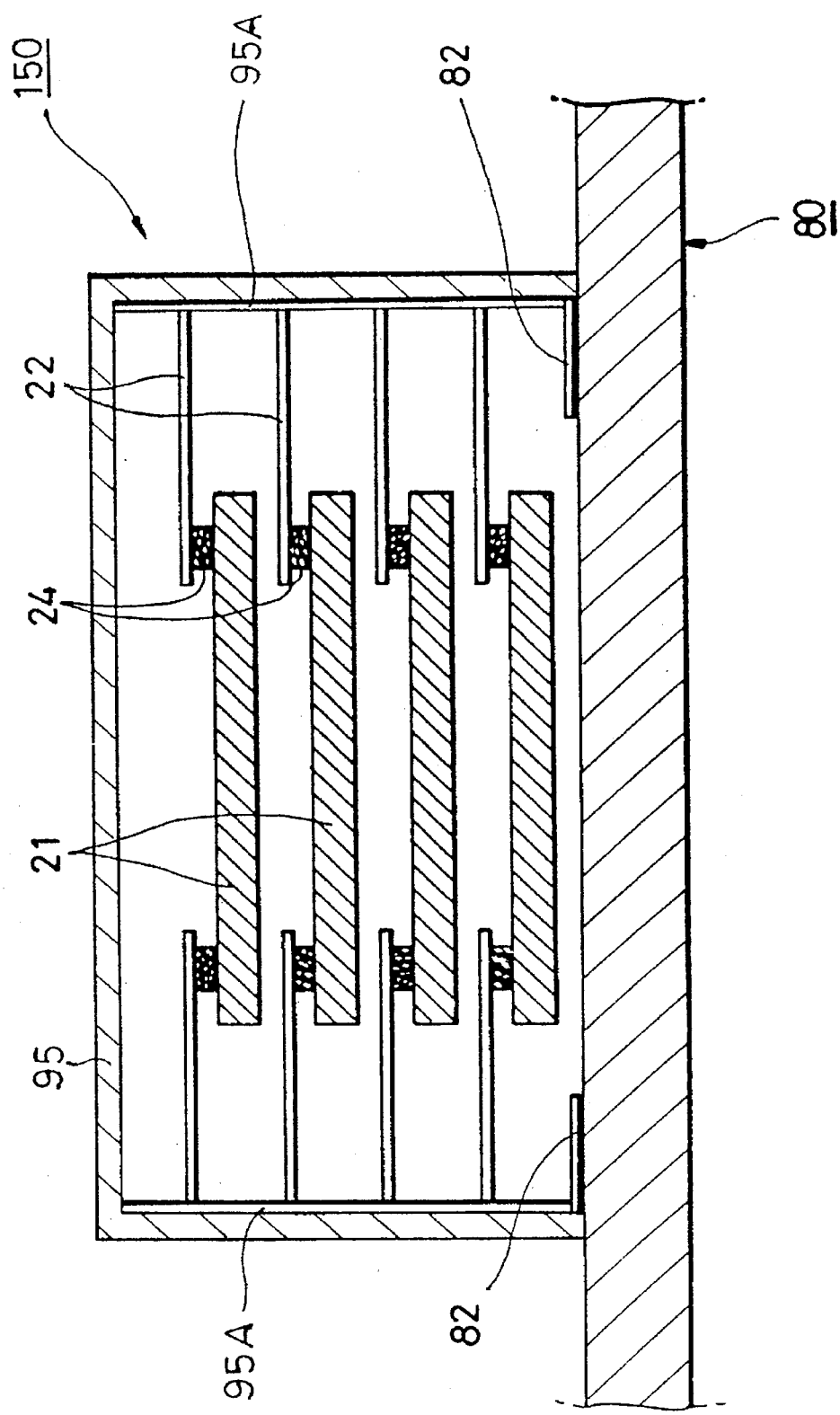
FIG. 2 is a cross-sectional view of another conventional semiconductor package stack.
Figure 3A:
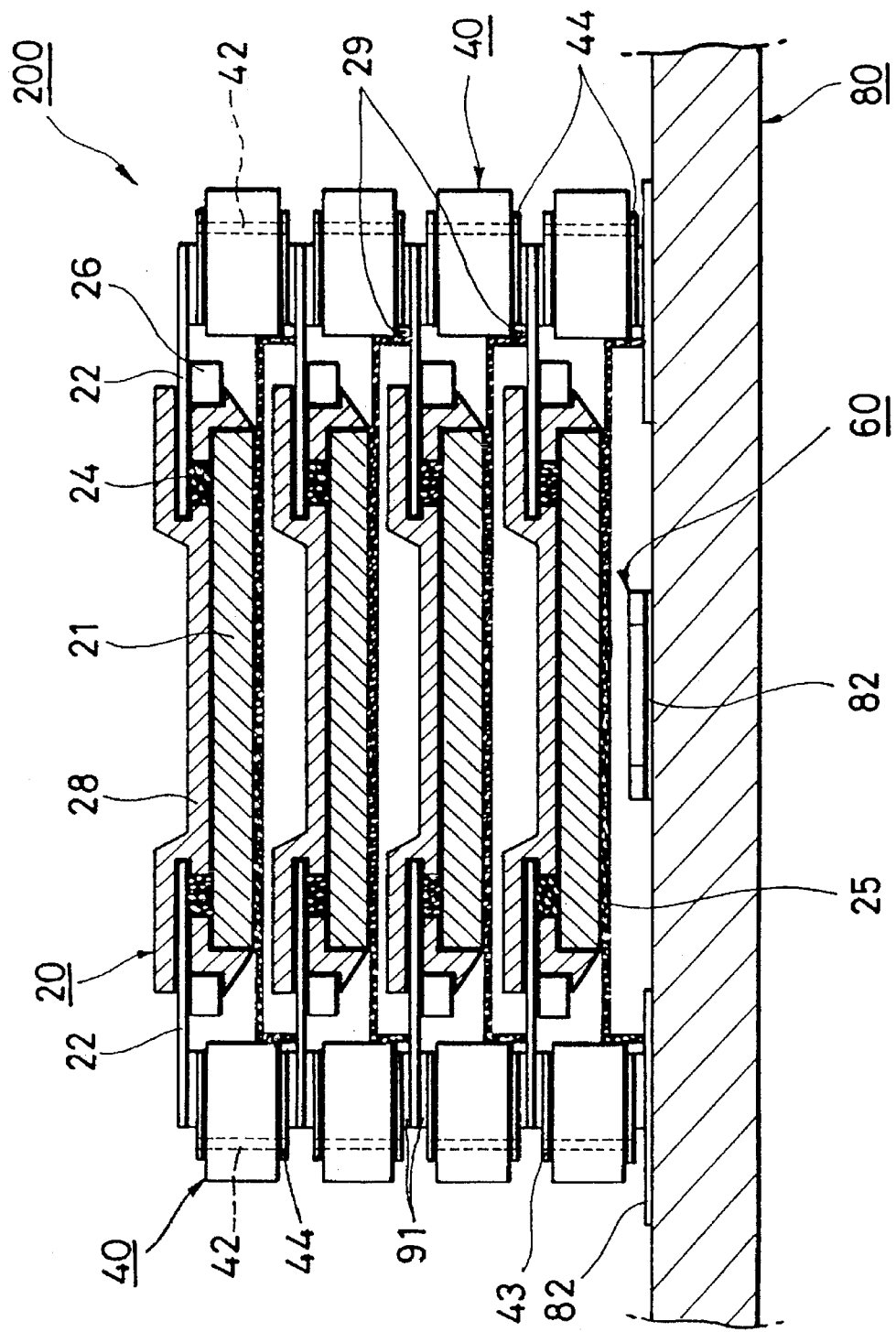
FIG. 3A is a cross-sectional view of one embodiment of a preferred semiconductor package stack according to the present invention.

With reference now to FIG. 3A, which is a cross-sectional view of one embodiment according to the present invention, the package (200) has a structure in which a plurality of, for example, four packages (20) are stacked in a single stack, in which the packages are physically interspersed with by frames (40) in a single series. The lowermost one of the frames (40) is surface mounted on ground land patterns (82) formed on the PCB (80) so that the lowermost one of the semiconductor chips (21) is located just above a capacitor (60) formed on a land pattern (82).

To describe in more detail, for the lowest (first) stacked package (20), extended outer leads (22) are electrically connected to circuit patterns (43) formed on an upper surface of the frame (40) of the lowest package (20) by solder (91), and the chip (21) is provided with a conductive film (25) on its exposed bottom surface, conductive film being electrically connected to the ground terminals (29) of the frame (40).

For the second stacked package (20), the extended outer leads (22) are electrically connected to circuit patterns (43) formed on an upper surface of the frame (40) of the second package, by a solder (91), an exposed bottom surface of the chip (21) is electrically connected by means of a conductive film (25) formed thereon, to the ground terminals (29) of the respective frame (40), and the circuit pattern (44) formed on the bottom surface of the respective frame (40) is electrically connected to the circuit pattern (43) formed on the upper surface of the frame (40) of the first stacked package, by solder (91). Consequently, there is formed a space between the bottom surface of the conductive film (25) of the second stacked package (20), and the upper surface of resin (28) of the first stacked package (20).

The third and fourth packages are consecutively stacked above the second stacked package by following the same fabrication process as described above.

Thus fabricated, the semiconductor package stack (200) is mounted on the PCB (80) in such a way that the circuit pattern (44) of the frame (40) of the first stacked package is connected to the ground land patterns (82) of the PCB (80) by solder (91). The semiconductor chip (21) of the first stacked package (20) as a result becomes located immediately above a capacitor (60) formed onto a land pattern (82) of the PCB (80). The packages (20) each have a structure in which bonding pads (not shown) are formed on the upper surface of the respective chip (21); leads (22) are formed on an insulating film (26) of a tape carrier; internal parts of the leads (22) are electrically connected by means of bumps (24) to the corresponding bonding pads; the chips (21), bumps (24) and leads (22) are encapsulated with a body of molded-in-place resin (28), for example epoxy molding compound, so that the bottom surface of the chip and extended outer parts of the leads (22) are exposed; and a ground conductive film (25) is formed on the exposed bottom surface of the chip.

The frames (40) are formed with circuit patterns (43) and (44) on their top and bottom surfaces, respectively, and formed with vertical through holes (42), which are indicated in FIG. 3A by broken lines. A conductive thin layer (not shown) is formed on the peripheral surface of each through hole and electrically connects the circuit patterns (43) and (44) together. The ground terminal (29) is formed on an edge of the frame (40).

The PCB (80) is formed so as to have the ground land patterns (83) and the land pattern (82) on its upper surface, and a capacitor (60) is formed on the land pattern (82) which faces the bottom surface of the first stacked package (20).

The ground land patterns (82) of the PCB (80), the circuit patterns (43) and (44) formed on the upper and bottom surfaces of the frame (40), respectively, the leads (22) of the package (20), bonding pads of the chips (21), the conductive film (25), and ground lines (now shown) formed on the PCB (80) are electrically interconnected.

The conductive film (25) and ground terminals (29) may be made of electrically conductive metals, for example copper, gold, silver, aluminum, tin, or alloys thereof, individually or as combinations (admixtures or compounds) thereof.

For the above-described package stack (200), the capacitor (60) is designed to serve as a noise filter when the package (200) is mounted on the ground land pattern (82) on the PCB (80).

Figure 3B:
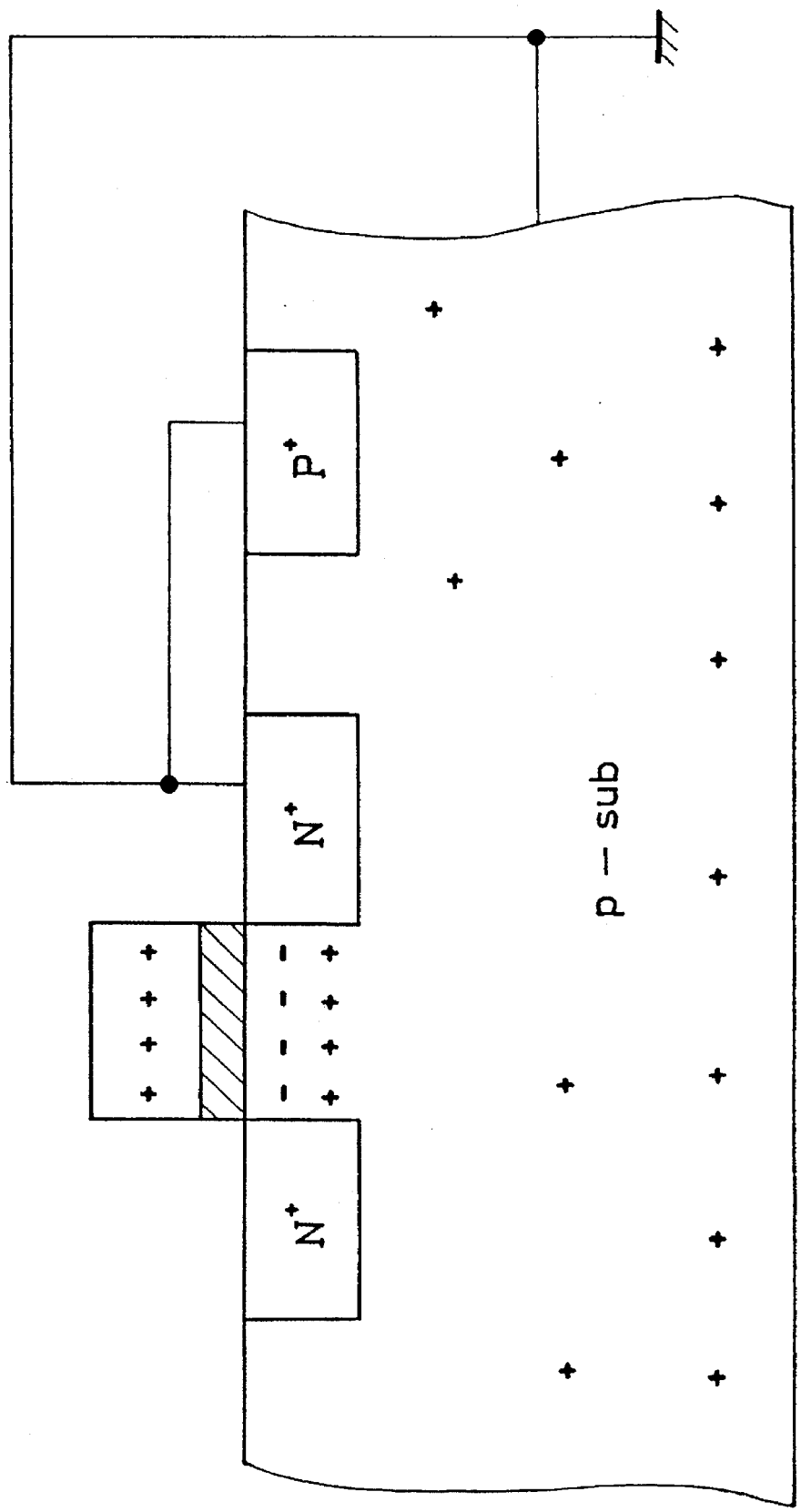
FIG. 3B is a cross-sectional view showing the working effect of the package depicted in FIG. 3A.

FIG. 3(B) is a cross-sectional view for showing the working effect of the package stack depicted in FIG. 3(A), wherein a MOS (Metal Oxide Semiconductor) element is formed with a PN diode between a silicone substrate and an active area thereof.

With reference now to FIG. 3(B), electrical noise can be effectively reduced, and a stable operation is accomplished, by forming a conductive film over the exposed surface of the chip, and grounding the conductive film and a capacitor for reducing the noise, the capacitor being connected to n+ and p+ embedded layers formed on the P-substrate. By doing this, holes move to Vss ground terminals, resulting in a reduction in the resistance of the P-substrate. This is the same form the N-substrate.

The substrate may be made of silicone, alumina ceramic, germanium-arsenic or the like.

Figure 4:
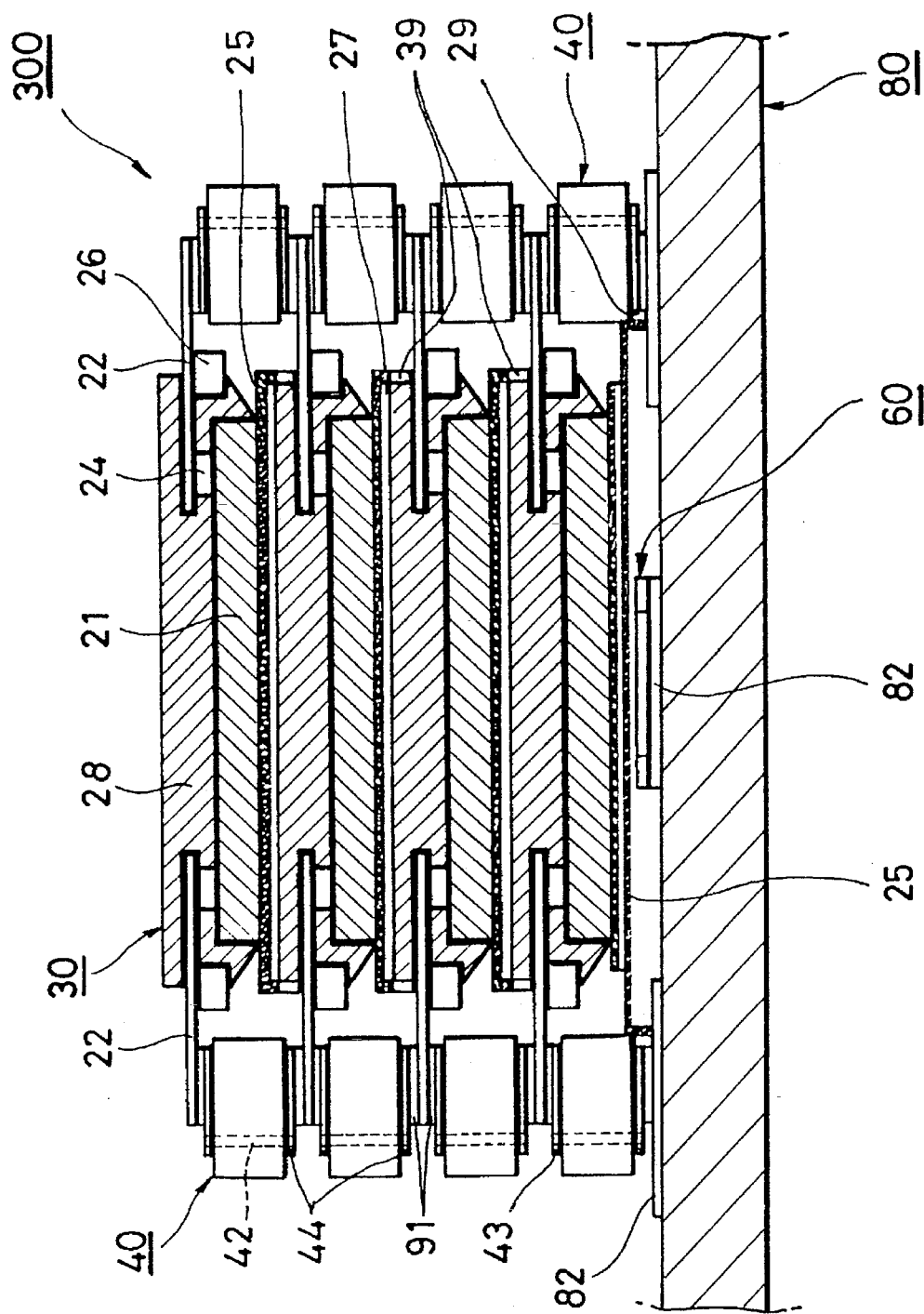
FIG. 4 is a cross-sectional view of another embodiment of a preferred semiconductor package stack according to the present invention.

With reference now to FIG. 4., which is a cross-sectional view of another embodiment according to this invention, the package stack (300) has the structure in which a plurality of, for example, four packages (30) are stacked so as to be serially interspersed with frames (40). The lowermost of the frames (40) is surface mounted on ground land patterns (82) formed on the PCB (80) so that the lowermost semiconductor chip (21) is located just above a capacitor (60) which is formed on a land pattern (82).

To describe in more detail, for the lowest (first) stacked package (30), extended outer leads (22) are electrically connected to circuit patterns (43) formed on an upper surface of the frame (40) of the lowest package (20) by solder (91), a conductive film (25) and an insulating film (27) are consecutively formed on the exposed bottom surface of the chip (21), the conductive film (25) is electrically connected to ground terminals (29) of the frame (40), and the ground terminals (39) are formed on the side surface of the resin (28), and are contacted to outer leads (22) and connected to the end of the conductive film (25).

For the second stacked package (30), an extended outer lead (22) is electrically connected to a circuit pattern (43) formed on an upper surface of the frame (40) of the second package by solder (91), a conductive film (25) and an insulating film (27) are consecutively formed on the exposed bottom surface of the chip (21), and the conductive film (25) is electrically connected to ground terminals (39) of the first stacked package (30). The ground terminals (39) are formed on the side surface of the resin (28), and are contacted to outer leads (22) and connected to the end of the conductive film (25). The circuit pattern (44) formed on the bottom surface of the frame (40) is electrically connected to the circuit pattern (43) formed on an upper surface of the frame (40) of the first stacked package, by solder (91).

Consequently, there is no space between the bottom surface of the conductive film (25), and the ground terminal (39) covering the resin (28) of the first stacked package (20).

The third and fourth packages are consecutively stacked above the second stacked package by following the same fabrication process.

Thus fabricated, the semiconductor package stack (300) is mounted on the PCB (80) in such a way that the circuit patterns (44) on the bottom surface of the frame (40) of the first stacked package are connected to ground land patterns (82) of the PCB (80), by solder (91). The semiconductor chip (31) of the first stacked package (30) becomes located immediately above a capacitor (60) formed onto a land pattern (82) of the PCB (80). The packages (30) each have a structure that bonding pads (now shown) are formed on the upper surface of the chip (21); leads (22) are formed on an insulating film (26) of a tape carrier; internal parts of the leads (22) are electrically connected, through bumps (24), to the corresponding bonding pads; the chips (21), bumps (24) and leads (22) are encapsulated by a body of molded-in-place resin (28) so that the bottom surface of the chip and an extended outer part of the leads (22) are exposed; the ground conductive film (25) and the insulating film (27) are consecutively formed on the exposed bottom surface of the chip; and the ground terminals (39) are formed on the side surface of the resin (28), and are contacted to outer leads (22) and connected to the end of the conductive film (25).

The frames (40) are formed so as to have circuit patterns (43) and (44) on its top and bottom surfaces, respectively, and formed so as to have vertical through holes (42), which are indicated in FIG. 4 by broken lines. Conductive thin layers (not shown) are formed on the respective peripheral bonding surfaces of the through holes, and electrically connect the circuit patterns (43) and (44) together. The ground terminals (29) are formed on edges of the frame (40) of the first stacked package only.

The PCB (80) is formed so as to have ground land patterns (82) and a land pattern (82) on its upper surface, and a capacitor (60) is formed on the land pattern (82) which faces the bottom surface of the first stacked package (20).

The ground land patterns (82) of the PCB (80), the circuit patterns (43) and (44) formed on the top and bottom surfaces of the frame (40), respectively, through holes (42), the leads (22) of the package (20), bonding pads of the chips (21), the conductive film (25), and ground lines (not shown) formed on the PCB (80) are electrically interconnected.

The conductive film (25) and ground terminals (29) (39) may be made of electrically conductive metals, for example copper, gold, silver, aluminum, tin, or alloys thereof, individually or as combinations (admixtures or compounds) thereof.

For the above-described package stack (300), the capacitor (60) is designed to serve as a noise filter, when the package stack is mounted (200) on the ground land pattern (82) on the PCB (80).

The stacked semiconductor package (300) allows a reduction of the electrical noise, and stable operation, by forming a conductive film (25) over the exposed surface of the chip, by forming ground terminals (39) on the side surface of the resin (28) and connecting them to the conductive film (25) and to the extended exposed outer leads (22), grounding the conductive film (25) of the first stacked package to the ground terminals (29), and grounding the conductive film (25) of the first stacked package and the capacitor (60) for reducing noise, the capacitor being connected to n+and p+embedded layers formed on the P-substrate. By doing this, the resistance of the P-substrate can be reduced and the operation of elements can be stabilized. This is the same for the N-substrate.

The substrate may be made of silicone, alumina ceramic, germanium-arsenic or the like.

Figure 5B:
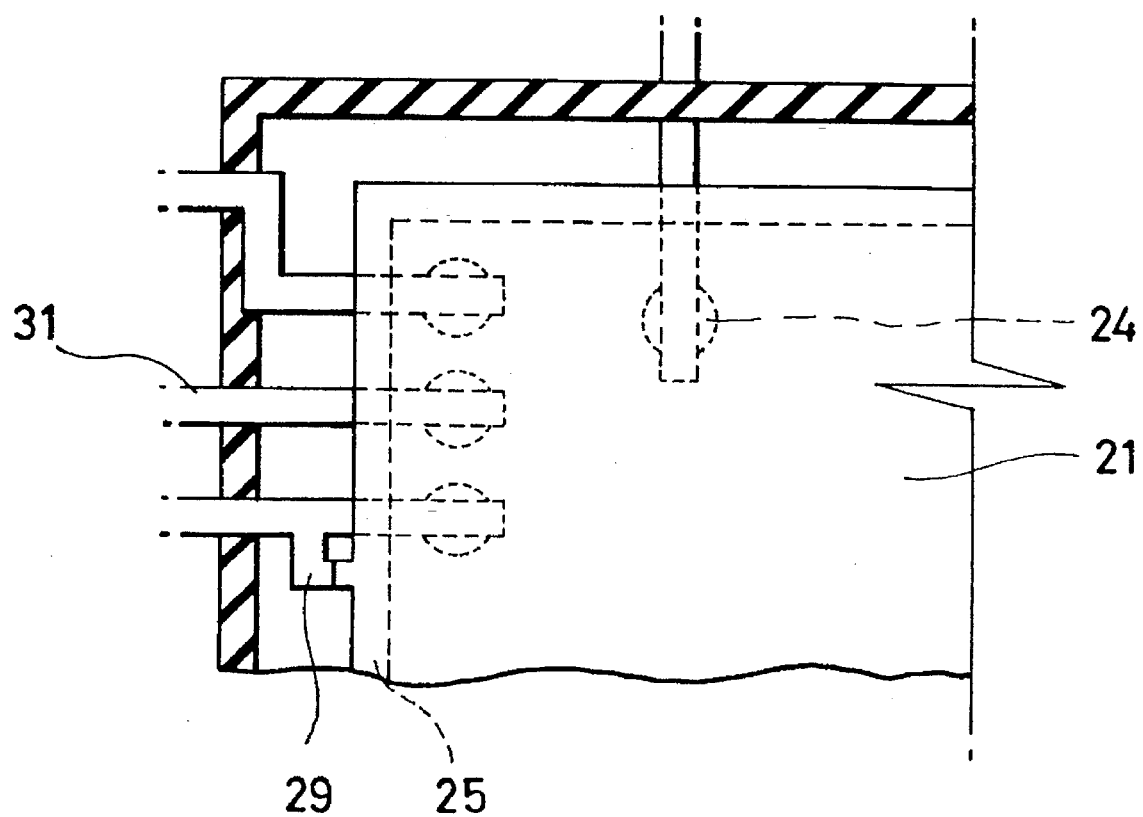
FIG. 5B is an enlarged fragmentary sectional view of a detail of the stack shown in FIG. 5A at a right angle to the viewing direction of FIG. 5A.

FIG. 5A is a cross-sectional view of another embodiment of preferred semiconductor package stack according to the present invention, and FIG. 5B is an enlarged fragmentary sectional view of part of the product in FIG. 5A.

The semiconductor package stack (400) has a structure in which a plurality of, for example, four packages (30) are stacked and enclosed against the substrate by a cap (95).

To describe in more detail, for the lowest (first) stacked package (40), a plurality of bonding pads (not shown) on the chip (21) are electrically connected to corresponding leads (22) by bumps (24), and the leads (22) are electrically interconnected to each other by means of conductive layers (95A) formed on inner opposite side surfaces of the cap (95).

The second through fourth stacked packages are fabricated in the same manner as described above.

The conductive layers (95A) are formed on the opposite inner side surfaces of the cap (95), and electrically interconnect the leads (22) together and further connect them to the ground land pattern (82) which is formed on the substrate (80). The cap (95) is mounted on the substrate (80) by known mounting techniques.

A ground conductive film (25) is formed on the exposed bottom surface of the chip (21), an insulating film (27) is formed thereon, and ground terminals (29), formed on both ends of the conductive film (25) of the upper stacked package, are electrically connected to the leads (22) formed on the chip of the lower next stacked package. The bumps (24) on the lowest (first) stacked package are connected to the ground land pattern (82), and the leads (22) are interconnected by means of the conductive layer (95A) of the cap (95), the conductive layer (95A) being connected to ground lines (not shown) of the substrate (80).

By inclining and extruding both ends of the conductive film (25), it is easily performed to electrically connect them to the leads (22) of the lower next stacked package by means of ground terminals (29), which are formed on both ends of the film (25) and contacted with the leads (22).

For the above-described very thin stacked packages, it is possible to reduce the noise and stabilize the operation of elements by grounding package to the substrate instead of forming a capacitor.

This is the same for the P-substrate, as well as for the N-substrate. The substrate may be made of silicone, alumina ceramic, germanium-arsenic or the like.

The conductive film feature of the present invention may be applied to all of the semiconductor package stack of the kinds which have exposed bottom surfaces of the semiconductor chips thereof, in order to reduce electrical noise.

Figure 6:
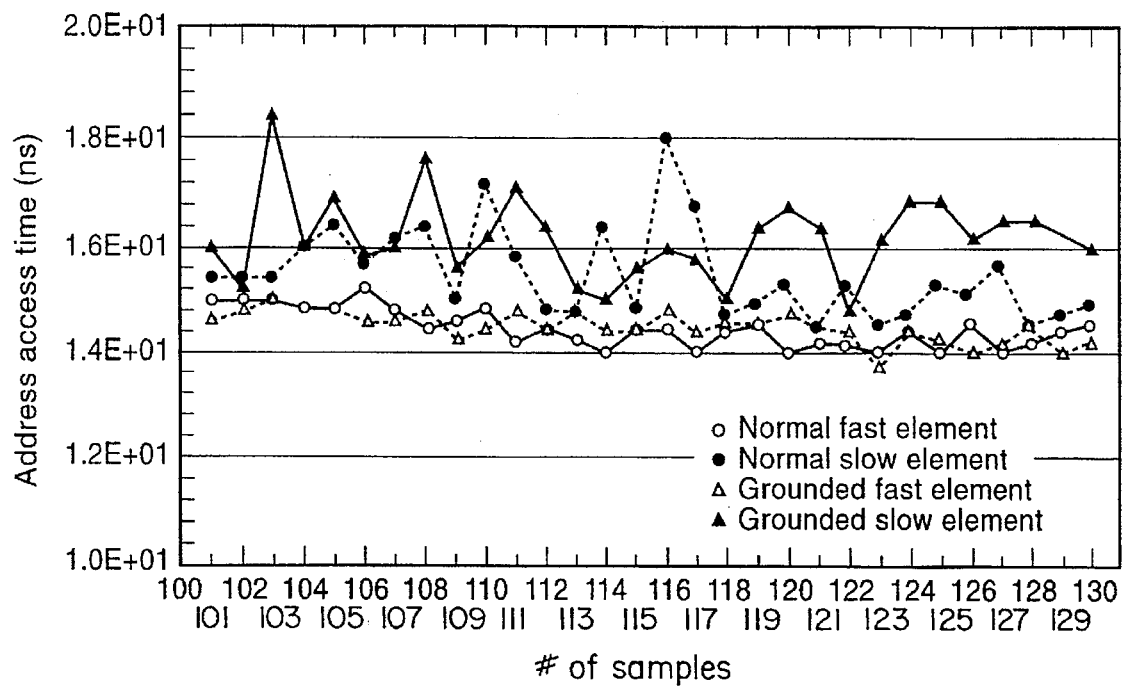
FIG. 6 is a graph showing operational characteristics of the semiconductor package according to the present invention.

FIG. 6 is a graph showing operational characteristics of the semiconductor package stack according to the present invention.

Figure 7:
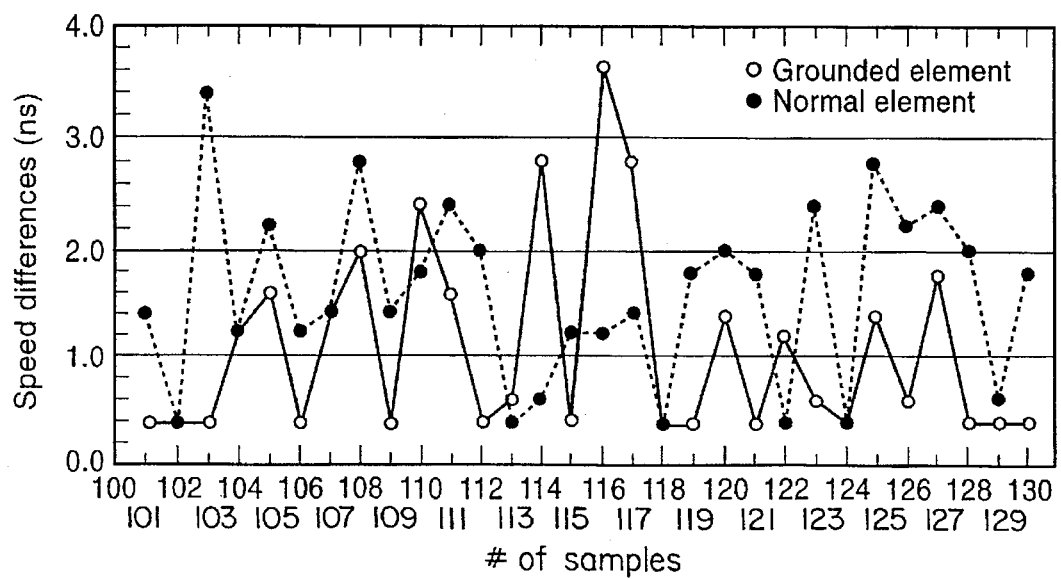
FIG. 7 is a graph showing operational characteristics of the semiconductor package according to the present invention.

FIG. 7 is a graph showing an operational characteristics of the semiconductor package according to the present invention.

In FIGS. 6 and 7, the abscissa indicates the number of element samples, and the ordinate indicates an address access time in nanoseconds (ns) and time difference between the fast and slow signal transfer, respectively.

Thirty 1M, high speed SRAM (Static Random Access Memory) elements having an SOJ structure of 32 pins, wherein a CMOS (Complementary Metal Oxide Semiconductor) is formed on the silicon P-substrate, were tested at 80° C. and at 4.4 V. For comparison, thirty elements having a conventional TAB flip chip package were tested.

With reference now to FIG. 6, elements having grounded packages show a faster access time and a lower variation between the fast and the slow signals, compared with the heretofore conventional elements. Therefore, it is confirmed that noise is reduced, and that the elements are stabilized by electrically grounding the stacked neighboring packages.

With reference now to FIG. 7, the speed differences between the fastest and slowest speed for the elements respectively having the above-described construction provided in accordance with the principles of the present invention, and common packages are depicted, and the speed differences due to instability of signal are also shown in Table 1.

TABLE 1

| Speed Difference | ≦0.6 ns | 0.6– 1.0 ns | 1.0– 2.0 ns | ≧2.0 ns | Total |
|---|---|---|---|---|---|
| | | | | (Unit: Number of elements) | |
| Group 1 | 17 | nil | 8 | 5 | 30 |
| Group 2 | 7 | nil | 12 | 11 | 30 |

Group 1 indicates elements having packages grounded to a P-substrate in accordance with the principles of the present invention, and Group 2 indicates elements having a conventional TAB flip chip package.

In the case of Group 1, the number of elements showing less than 0.6 ns of speed difference is 17 and the number of elements showing more than 1.0 ns is 13, while in the case of Group 2, the number of elements showing less than 0.6 ns speed difference is 7, and the nmmber of elements showing more than 1.0 ns is 23. Accordingly, it is confirmed that the elements having the grounded packages provide a faster access time and more stable signals, compared with the elements having the conventional grounded packages. These effects are higher at the higher signal transferring signal.

Thus, the semiconductor package stack provided in accordance with the principles of the present invention allow a reduction of electrical noise, and a high speed, switching speed by forming a conductive film on the bottom surface of the chips of the individual packages, and connecting the film to the ground lines on the substrate.

Although preferred embodiments of the present invention have been described in detail hereinabove, it should be clearly understood that many variations and/or modifications of the basic inventive concepts herein taught which may appear to those skilled in the art, will still fall within the spirit and scope of the present invention as defined in the appended claims.

What is claimed is:

1. A semiconductor package stack providing reduced electrical noise, comprising:

a plurality of semiconductor packages, each package being stacked one upon another in a single stack having a lowermost said package, each said package having a semiconductor chip having a plurality of bonding pads, a plurality of inner and outer leads, an insulating film of film carrier, which mounts said chip by electrically connecting said bonding pads thereof to corresponding ones of said inner leads by bumps, and a molded-in-place covering which protects the chip and inner leads from the external environment, said chip having an exposed bottom surface;

a plurality of frames each having a top surface and a bottom surface, each said frame being formed so as to have circuit patterns on the top and bottom surfaces thereof, said frames being alternating interspersed with said packages in said stack, with a frame lowermost, said circuit patterns being electrically connected to respective ones of the outer leads to unite the semiconductor packages into a stack;

a substrate formed so as to have ground land patterns, said ground land patterns being electrically commonly connected to said circuit patterns on respective ones of said frames;

an electrically conductive film formed on the exposed bottom surface of the chip of each said package, said electrically conductive film being effectively connected to said inner leads; and a plurality of ground terminals, which are electrically connected to said conductive film as well as to said ground land patterns formed on said substrate.

2. The semiconductor package stack of claim 1, wherein:

said conductive film is made of a metal selected from the group consisting of copper, gold, silver, aluminum, tin, and alloys thereof.

3. The semiconductor package stack of claim 1, wherein:

said ground terminals are made of a metal selected from the group consisting of copper, gold, silver, aluminum, tin, and alloys thereof.

4. The semiconductor package stack of claim 1, wherein:

said ground terminals are electrically connected to respective ones of said outer leads.

5. The semiconductor package stack of claim 1, wherein:

said frames have edges and said ground terminals are located at said edges of said frames.

6. The semiconductor package stack of claim 1, further comprising:

at least one capacitor for reducing electrical noise, each said capacitor being formed onto a land pattern formed on an area of the substrate located directly beneath the exposed bottom surface of the chip.

7. A semiconductor package stack providing reduced electrical noise comprising:

a plurality of semiconductor packages, each package being stacked one upon another in a single stack having a lowermost said package, each said package having a semiconductor chip having a plurality of bonding pads, a plurality of inner and outer leads, an insulating film of film carrier, which mounts said chip by electrically connecting said bonding pads thereof to corresponding ones of said inner leads by bumps, and a molded-in-place covering which protects the chip and inner leads from the external environment, said chip having an exposed bottom surface;

a plurality of frames each having a top surface and a bottom surface, each said frame being formed so as to have circuit patterns on the top and bottom surfaces thereof, said frames being alternating interspersed with said packages in said stack, with a frame lowermost, said circuit patterns being electrically connected to respective ones of the outer leads to unite the semiconductor packages into a stack;

a substrate formed so as to have ground land patterns, said ground land patterns being electrically commonly connected to said circuit patterns on respective ones of said frames;

an electrically conductive film formed on the exposed bottom surface of the chip of each said package, so as to have an outer surface, said electrically conductive film being effectively connected to said inner leads;

an insulating film formed on said surface of the conductive film; and a plurality of ground terminals, which are electrically connected to said conductive film as well as to said ground land patterns formed on said substrate.

8. The semiconductor package stack of claim 7, wherein:

said lowermost package is formed so as to provide said insulating film and conductive film consecutively on the exposed bottom surface of the chip thereof.

9. The semiconductor package stack of claim 7, wherein:

said frames have edges and said ground terminals are located on said edges of said frame of said lowermost package.

10. The semiconductor package stack of claim 7, wherein:

said ground terminals are electrically connected to corresponding ones of said outer leads except for those of said lowermost package.

11. The semiconductor package stack of claim 7, further comprising:

at least one capacitor for reducing electrical noise, each said capacitor being formed onto a land pattern formed on an area of the substrate located directly beneath the exposed bottom surface of the chip.

12. The semiconductor package stack of claim 7, wherein:

said conductive film is made of a metal selected from the group consisting of copper, gold, silver, aluminum, tin, and alloys thereof.

13. The semiconductor package stack of claim 7, wherein:

said ground terminals are made of a metal selected from the group consisting of copper, gold, silver, aluminum, tin, and alloys thereof.

14. A semiconductor package stack providing reduced electrical noise, comprising:

a plurality of semiconductor packages, each package being stacked one upon another in a single stack having a lowermost said package, each said package having a semiconductor chip having a plurality of bonding pads, and a plurality inner and outer leads electrically connected to the corresponding bonding pads by bumps to mount the respective chip;

a cap formed so as to have conductive layers on inner opposite side surfaces thereof, said conductive layers commonly electrically connecting respective outer leads of each package together to unite the semiconductor packages;

a substrate formed so as to have land patterns, said land patterns being electrically connected to respective ones of said outer leads via said conductive layers of said cap; each said package having:

an electrically conductive film formed on a bottom surface of the chip thereof, said electrically conductive film being effectively connected to said inner leads;

an insulating film formed on a surface of the conductive film; and a plurality of ground terminals, which are electrically connected to the conductive film and to said ground land patterns formed on the substrate.

15. The semiconductor package stack of claim 14, wherein:

said conductive film is made of a metal selected from the group consisting of copper, gold, silver, aluminum, tin, and alloys thereof.

16. The semiconductor package stack of claim 14, wherein:

said ground terminals are made of a metal selected from the group consisting of copper, gold, silver, aluminum, tin, and alloys thereof.

* * * * *